US011233453B2

(12) United States Patent
Ishikawa et al.

(10) Patent No.: US 11,233,453 B2
(45) Date of Patent: Jan. 25, 2022

(54) POWER CONVERSION DEVICE INCLUDING A BOOSTING CONVERTER FOR BOOSTING OUTPUT VOLTAGE FROM A DC POWER SUPPLY

(71) Applicant: Mitsubishi Electric Corporation, Chiyoda-ku (JP)

(72) Inventors: Shuta Ishikawa, Chiyoda-ku (JP); Akihiko Iwata, Chiyoda-ku (JP); Tatsuki Matsunaga, Chiyoda-ku (JP); Koyo Matsuzaki, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/645,689

(22) PCT Filed: Aug. 21, 2018

(86) PCT No.: PCT/JP2018/030807
§ 371 (c)(1),
(2) Date: Mar. 9, 2020

(87) PCT Pub. No.: WO2019/123716
PCT Pub. Date: Jun. 27, 2019

(65) Prior Publication Data
US 2020/0287463 A1    Sep. 10, 2020

(30) Foreign Application Priority Data
Dec. 18, 2017    (JP) .............................. JP2017-241423

(51) Int. Cl.
*H02M 3/158*    (2006.01)
*G01R 19/165*    (2006.01)
(Continued)

(52) U.S. Cl.
CPC .... *H02M 3/1584* (2013.01); *G01R 19/16528* (2013.01); *H02M 1/32* (2013.01);
(Continued)

(58) Field of Classification Search
CPC .... H02M 3/1584; H02M 1/32; H02M 1/0006; H02M 7/483; G01R 19/16528; H03K 5/24; H02P 27/06
See application file for complete search history.

(56) References Cited

U.S. PATENT DOCUMENTS 9,998,007 B2 *    6/2018    Yuasa ................... H02M 3/158
2013/0021011 A1 *   1/2013    Okuda .................. H02M 3/158
                                                    323/282

(Continued)

FOREIGN PATENT DOCUMENTS

JP    2007-166815 A    6/2007
JP    2012-239324 A    12/2012
(Continued)

OTHER PUBLICATIONS

International Search Report dated Oct. 30, 2018 in PCT/JP2018/030807 filed Aug. 21, 2018, 2 pages.

*Primary Examiner* — Rafael O De Leon Domenech
(74) *Attorney, Agent, or Firm* — Xsensus LLP

(57) ABSTRACT

The power conversion device includes a multilevel boosting circuit and a smoothing capacitor for smoothing output voltage of the multilevel boosting circuit. The multilevel boosting circuit includes: a leg portion in which four semiconductor elements, i.e., a first diode, a second diode, a first switching element, and a second switching element are connected in series; and an intermediate capacitor connected between a connection point of the first diode and the second diode, and a connection point of the first switching element and the second switching element. When voltage of the smoothing capacitor becomes a reference voltage value or
(Continued)

more, the control unit executes a protection mode to fix the first switching element and the second switching element in OFF states.

21 Claims, 17 Drawing Sheets

(51) Int. Cl.
  *H02M 1/32* (2007.01)
  *H02M 7/483* (2007.01)
  *H02P 27/06* (2006.01)
  *H03K 5/24* (2006.01)
  *H02M 1/00* (2006.01)

(52) U.S. Cl.
  CPC ............ *H02M 7/483* (2013.01); *H02P 27/06* (2013.01); *H03K 5/24* (2013.01); *H02M 1/0006* (2021.05)

(56) References Cited

U.S. PATENT DOCUMENTS

2013/0119961 A1* 5/2013 Okuda .................. H02M 3/158
                                                             323/299
2017/0170770 A1* 6/2017 Tsukano .................. H02P 27/14

FOREIGN PATENT DOCUMENTS

| JP | 2014-33553 A | 2/2014 |
| JP | 2016-19402 A | 2/2016 |

* cited by examiner

FIG. 3

| GATE SIGNAL | LATCH UNIT OUTPUT | GATE BLOCK UNIT OUTPUT |
|---|---|---|
| 0 | 0 | 0 |
| 0 | 1 | 0 |
| 1 | 0 | 1 |
| 1 | 1 | 0 |

FIG. 5

| | VOLTAGE [V] |
|---|---|
| SMOOTHING CAPACITOR | 1030 |
| INTERMEDIATE CAPACITOR | 425 |
| FIRST DIODE | 302.5(*) |
| SECOND DIODE | 212.5(*) |
| FIRST SWITCHING ELEMENT | 212.5(*) |
| SECOND SWITCHING ELEMENT | 302.5(*) |

FIG. 6

COMPARATIVE EXAMPLE

| | VOLTAGE [V] | | | | |
|---|---|---|---|---|---|
| | G1:OFF G2:OFF | G1:ON G2:OFF | G1:OFF G2:ON | G1:ON G2:ON |
| SMOOTHING CAPACITOR | 1030 | 1030 | 1030 | 1030 |
| INTERMEDIATE CAPACITOR | 425 | 425 | 425 | 425 |
| FIRST DIODE | 302.5(*) | 302.5(*) | 605 | 605 |
| SECOND DIODE | 212.5(*) | 425 | 212.5(*) | 212.5(*) |
| FIRST SWITCHING ELEMENT | 212.5(*) | 0 | 212.5(*) | 212.5(*) |
| SECOND SWITCHING ELEMENT | 302.5(*) | 302.5(*) | 0 | 0 |

FIG. 10

| GATE SIGNAL FOR STEP-DOWN CIRCUIT | LATCH UNIT OUTPUT | GATE BLOCK UNIT OUTPUT FOR STEP-DOWN CIRCUIT (METHOD A) | GATE BLOCK UNIT OUTPUT FOR STEP-DOWN CIRCUIT (METHOD B) |
|---|---|---|---|
| 0 | 0 | 0 | 0 |
| 0 | 1 | 0 | 1 |
| 1 | 0 | 1 | 1 |
| 1 | 1 | 0 | 1 |

FIG. 17

| GATE SIGNAL FOR STEP-DOWN CIRCUIT | | LATCH UNIT OUTPUT | GATE BLOCK UNIT OUTPUT FOR STEP-DOWN CIRCUIT (METHOD A) | | GATE BLOCK UNIT OUTPUT FOR STEP-DOWN CIRCUIT (METHOD B) | |
| --- | --- | --- | --- | --- | --- | --- |
| G4a | G5a | | G4 | G5 | G4 | G5 |
| 0 | 0 | 0 | 0 | 0 | 0 | 0 |
| 0 | 1 | 0 | 0 | 1 | 0 | 1 |
| 0 | 1 | 1 | 0 | 0 | 1 | 0 |
| 1 | 0 | 0 | 1 | 0 | 1 | 0 |
| 1 | 0 | 1 | 0 | 0 | 1 | 0 |

POWER CONVERSION DEVICE INCLUDING A BOOSTING CONVERTER FOR BOOSTING OUTPUT VOLTAGE FROM A DC POWER SUPPLY

TECHNICAL FIELD

The present disclosure relates to a power conversion device.

BACKGROUND ART

Conventionally, a power conversion device that performs the following control for suppressing application of overvoltage to a semiconductor element in the power conversion device is disclosed.

In a power conversion unit of a DC/DC power conversion device, switching elements S1, S2 and diodes D1, D2 are arranged in series, and resistors R4, R3, R2, R1 are respectively arranged in parallel to the switching elements S1, S2 and the diodes D1, D2. The switching elements S1, S2 are voltage balance resistors for adjusting voltages applied to the diodes D1, D2. When the input voltage of an input terminal of a DC power, supply is zero or greatly reduced and the switching elements S1, S2 are in a control stopped state, the voltage balance resistors R1 to R4 keep a voltage balance of the switching elements S1, S2 and the diodes D1, D2 (see, for example, Patent Document 1).

In addition, for example, a power conversion device that performs the following control is disclosed.

An overvoltage detector outputs a trip signal for an inverter when the DC voltage of a smoothing capacitor exceeds a predetermined overvoltage value. A DC voltage monitor measures a time period in which the DC voltage of the smoothing capacitor is equal to or greater than an overvoltage threshold value, by a timer, and outputs an alarm when a predetermined time period or longer has elapsed. Then, a voltage reduction measure by a manual operation such as opening a capacitor of a system is performed (see, for example, Patent Document 2).

CITATION LIST

Patent Document

Patent Document 1: Japanese Laid-Open Patent Publication No. 2021-33553 (paragraphs [0014] to [0017], FIG. 1, FIG. 2, FIG. 3)

Patent Document 2: Japanese Laid-Open Patent Publication No. 2007-166815 (paragraphs [0015] to [0032], FIG. 1, FIG. 2)

SUMMARY OF THE INVENTION

Problems to be Solved by the Invention

The conventional power conversion device described in Patent Document 1 can suppress overvoltage of each semiconductor element when the input, voltage is zero or greatly reduced and the power conversion device is stopped. However, in the case where a situation in which overvoltage is applied to each semiconductor element occurs during operation of the power conversion device, this cannot be suppressed.

In the conventional power conversion device described in Patent Document 2, a voltage reduction measure by a manual operation such as opening the capacitor is performed in the case of overvoltage of the smoothing capacitor. However, a measure using the manual operation requires a time until the voltage reduction measure is performed from when the overvoltage has occurred, and therefore it is impossible to eliminate the overvoltage swiftly.

In particular, in a power conversion device that includes a boosting converter and an inverter and that converts boosted DC voltage to AC voltage and outputs the AC voltage to a load, if, for example, abnormality has occurred in the power conversion device or abnormality has occurred in a load operation, bus voltage might increase due to regeneration power from the load, leading to increase in the voltage of the smoothing capacitor connected to the bus voltage. Due to the voltage increase in the smoothing capacitor, excessive voltage might be applied to each semiconductor element in the power conversion device. In particular, in the case of using a multi level boosting converter capable of outputting multilevel voltages, in general, the withstand voltage of the semiconductor element of the boosting converter is set to be lower than the withstand, voltage of the semiconductor element of the inverter. Therefore, overvoltage is likely to be applied to each semiconductor element.

The present disclosure has been made to solve the above problem, and an object of the present disclosure is to provide a power conversion device capable of swiftly suppressing overvoltage on a semiconductor element in the power conversion device during operation of the power conversion device.

Solution to the Problems

A power conversion device according to the present disclosure includes: a boosting converter for boosting output voltage from a DC power supply unit; a smoothing capacitor for smoothing output voltage of the boosting converter; an inverter for converting voltage of the smoothing capacitor, to AC voltage; and a control unit for controlling the boosting converter and the inverter.

The boosting converter includes
a reactor having a first end connected to the DC power supply unit,
a leg portion including four semiconductor elements composed of a first semiconductor element, a second semiconductor element, a first semiconductor switching element, and a second semiconductor switching element each of which controls conduction and interruption of current, the four semiconductor elements being connected in series between positive and negative terminals of the smoothing capacitor, a second end of the reactor being connected to a connection point between the second semiconductor element and the first semiconductor switching element, and
  an intermediate capacitor connected between a connection point of the first semiconductor element and the second semiconductor element, and a connection point of the first semiconductor switching element and the second semiconductor switching element.

In a normal mode, the control unit performs ON/OFF control for the first semiconductor switching element and the second semiconductor switching element so as to cause the boosting converter to output multilevel voltages, and when voltage of the smoothing capacitor is equal to or greater than a reference voltage value, the control unit executes a protection mode to fix the first semiconductor switching element and the second semiconductor switching element in OFF states.

Effect of the Invention

The power conversion device according to the present disclosure can suppress overvoltage on each semiconductor element in the power conversion device during operation of the power conversion device. Thus, it is possible to provide a highly reliable power conversion device that suppresses deterioration in each semiconductor element.

BRIEF DESCRIPTION OF THE DRAWINGS

FIG. 3 shows the relationship between input and output of a gate block unit according to embodiment 1.

FIG. 5 shows voltages at several parts in the power conversion device according to embodiment 1.

FIG. 6 shows voltages at several parts in a power conversion device in a comparative example.

FIG. 10 shows the relationship between input and output of a gate block unit according to embodiment 2.

FIG. 17 shows the relationship between input and output of a gate block unit according to embodiment 4.

DESCRIPTION OF EMBODIMENTS

Embodiment 1

Hereinafter, a power conversion device 100 according to embodiment 1 of the present disclosure will be described with reference to the drawings.

Figure 1:
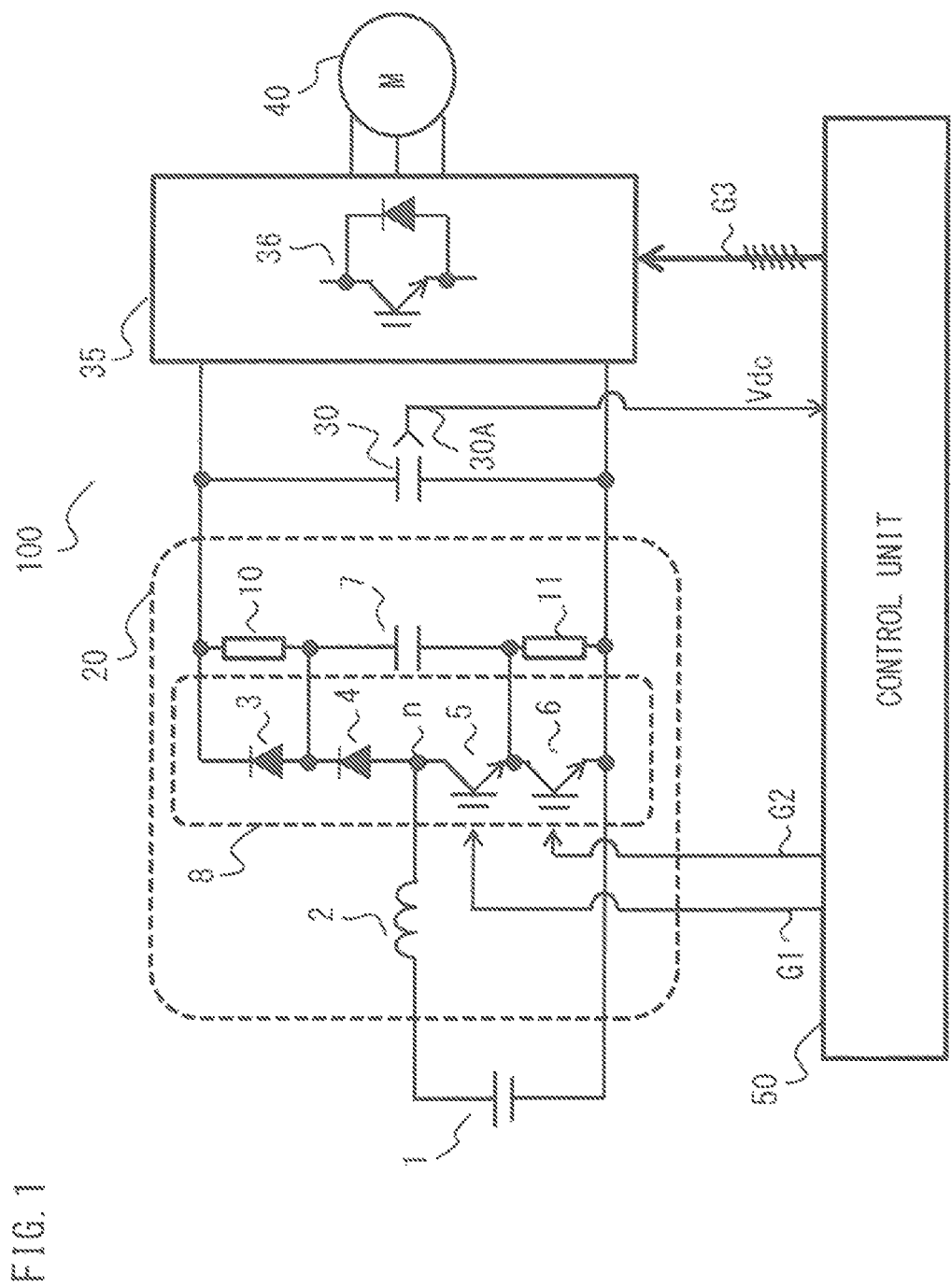
FIG. 1 is a diagram showing the schematic configuration of a power conversion system including a power conversion device according to embodiment 1.

FIG. 1 is s diagram showing the schematic configuration of a power conversion system including the power conversion device 100 according to embodiment 1.

Figure 2:
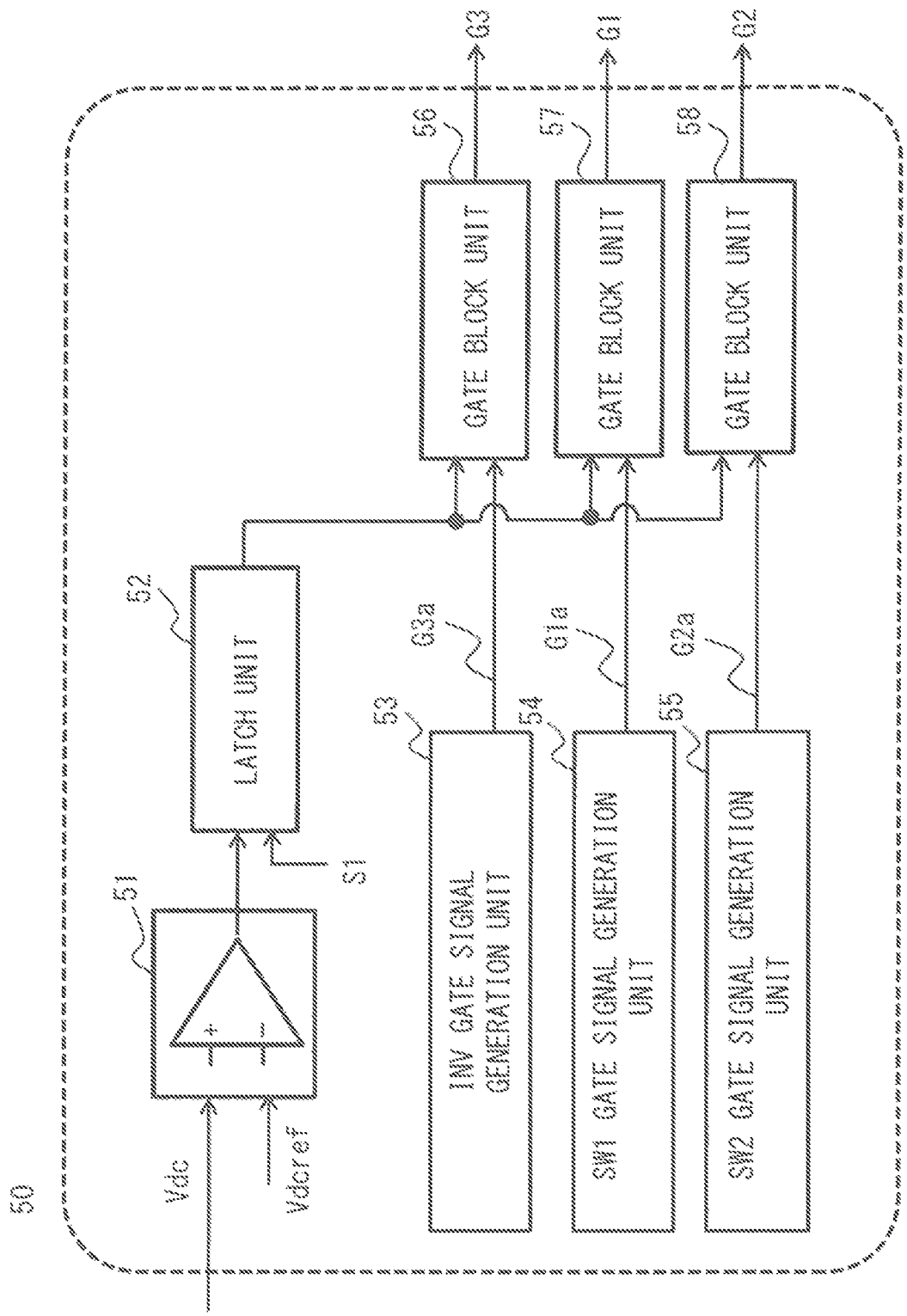
FIG. 2 is an internal configuration diagram of a control unit according to embodiment 1.

FIG. 2 is an internal configuration diagram of a control unit 50 in the present embodiment 1.

FIG. 3 shows the relationship between input and output of gate block units 56, 57, 58 of the control unit 50 shown in FIG. 2.

As shown in FIG. 1, the power conversion device 100 is provided between a DC power supply unit 1 and an AC motor 40, and converts DC voltage from the DC power supply unit 1, to drive the AC motor 40.

The power conversion device 100 includes a multilevel boosting circuit 20 serving as a boosting converter for boosting output voltage from the DC power supply unit 1, a smoothing capacitor 30 for smoothing output voltage of the multilevel boosting circuit 20, an inverter 35 which converts the voltage smoothed by the smoothing capacitor 30 to AC voltage and outputs the AC voltage to the AC motor 40, and a control unit 50 for controlling the multilevel boosting circuit 20 and the inverter 35.

The power conversion device 100 configured as described above, the DC power supply unit 1, and the AC motor 40 form the power conversion system of the present embodiment.

The multilevel boosting circuit 20 of the power conversion device 100 includes a reactor 2, a leg portion 8 connected between positive and negative terminals of the smoothing capacitor 30, an intermediate capacitor 7, and balance resistors 10, 11.

The leg portion 8 of the multilevel boosting circuit 20 includes a first diode 3 as a first semiconductor element, a second diode 4 as a second semiconductor element, a first switching element 5 as a first semiconductor switching element, and a second switching element 6 as a second semiconductor switching element which are arranged in this order from the side connected to the positive terminal of the smoothing capacitor 30 and each of which controls conduction and interruption of current, and these four semiconductor elements are connected in series.

The first diode 3 and the second diode 4 are arranged so that current flows from an intermediate node n which is the connection point between the second diode 4 and the first switching element 5 toward the positive output end of the multilevel boosting circuit 20. In addition, the first switching element 5 and the second switching element 6 are arranged so that, current flows from the intermediate node n toward the negative output end of the multilevel boosting circuit 20.

The output end, i.e., the second end of the reactor 2 is connected to the intermediate node n, and the input end, i.e., the first end of the reactor 2 is connected to the DC power supply unit 1.

The positive terminal of the intermediate capacitor 7 is connected to the connection point between the first diode 3 and the second diode 4, and the negative terminal of the intermediate capacitor 7 is connected to the connection point between the first switching element 5 and the second switching element 6.

Further, a balance resistor 10 is connected in parallel to the first diode 3, and a balance resistor 11 is connected in parallel to the second switching element 6. Thus, in the present embodiment, the balance resistors 10, 11 are connected to only the first diode 3 and the second switching element 6 among the four semiconductor elements included in the leg portion 8. The balance resistors 10, 11 are provided for the purpose of stabilizing the ratio of applied voltages distributed to the semiconductor elements of the leg portion 3.

Although simplified in FIG. 1, the inverter 35 includes a total of six switching elements 36 which are provided two for each phase, in order to convert DC power to three-phase AC power.

The power conversion device 100 includes voltage detection means 30A for detecting voltage Vdc of the smoothing capacitor 30. The detected smoothing capacitor voltage Vdc is inputted to the control unit 50.

The first switching element 5 and the second switching element 6 used in the leg portion 3 of the multilevel boosting circuit 20 are formed from semiconductor elements such as insulated gate bipolar transistors (IGBT) or metal-oxide-semiconductor field-effect transistors (MOSFET). The first switching element 5 and the second switching element 6 may have diodes in antiparallel thereto. As a matter of course, the materials of the semiconductor elements (first diode 3, second diode 4, first switching element second switching element 6) of the leg portion 3 may be Si (silicon) or may be semiconductors such as SiC (silicon carbide) and GaN (gallium nitride).

The first diode 3 and the second diode 4 may be replaced with semiconductor elements such as IGBT or MOSFET having switching functions and having diodes connected in antiparallel. However, in the present embodiment, regeneration operation of the multilevel boosting circuit 20 is not needed, and therefore diodes are used.

The AC motor 40 may be an induction motor or a synchronous motor.

Next, the detailed operation of the multilevel boosting circuit 20 will be described.

The multilevel boosting circuit 20 has a function of boosting the voltage of the smoothing capacitor 30, and generates, at the intermediate capacitor 1, DC voltage equal to or smaller than the voltage of the smoothing capacitor 30. That is, the multilevel boosting circuit 20 has a feature that the output voltage level thereof can be multiple levels, i.e., three levels.

If voltage Vm of the intermediate capacitor 7 is controlled to be ½ Vdc which is half the smoothing capacitor voltage Vdc, the multilevel boosting circuit 20 can make outputs at three levels, i.e., 0, ½ Vdc, and Vdc. Such a multilevel boosting circuit has a feature that switching loss of switching elements can be reduced and carrier ripple current of a reactor can be reduced, thus achieving high efficiency.

Next, the configuration and control of the control unit 50 will be described with reference to FIG. 2.

As shown in FIG. 2, the control unit 50 includes a comparing device 51, a latch unit 52, gate block units 56, 57, 58, and gate signal generation units 53, 54, 55. The control unit 50 may be formed from an analog circuit or may be formed from an application specific integrated circuit (ASIC), a field-programmable gate array (FPGA), a microcomputer, or the like.

Hereinafter, the details of each block in the control unit 50 will be described.

The smoothing capacitor voltage Vdc detected by the voltage detection means 30A is inputted to the plus side of the comparing device 51, and a comparison signal Vdcref as a reference voltage value is inputted to the minus side of the comparing device 51. As the comparison signal Vdcref, voltage serving as a reference for stopping the inverter 35 is inputted. Regarding the setting value for the comparison signal Vdcref, in the case of the inverter of AC 200 V system, the comparison signal Vdcref is set to approximately 400 V, and in the case of the inverter of AC 400 V system, the comparison signal Vdcref is set to approximately 800 V.

The comparing device 51 compares the inputted smoothing capacitor voltage Vdc and the comparison signal Vdcref. If smoothing capacitor voltage Vdc<comparison signal Vdcref is satisfied, the comparing device 51 outputs "0", and if smoothing capacitor voltage Vdc≥comparison signal Vdcref is satisfied, the comparing device 51 outputs "1".

That is, the comparing device 51 outputs "1" only in an abnormal case where the smoothing capacitor voltage Vdc is overvoltage equal to or greater than the reference voltage value, and the comparing device 51 outputs "0" in the other normal cases. Thus, the comparing device 51 has an abnormality determination function of detecting overvoltage of the smoothing capacitor 30. The output result from the comparing device 51 is outputted to the latch unit 52.

In the case where the comparing device 51 is formed by an analog circuit, it is general that the comparing device 51 is formed using a comparator. As a matter, of course, the comparing device 51 may be formed by ASIC or FPGA.

Next, the latch unit 52 will be described. The latch unit 52 is provided for, when the comparing device 51 has detected overvoltage, holding "1" which is a signal for abnormal case until a release signal S1 is inputted.

In the case where the latch unit 52 is formed by a logic circuit, the latch unit 52 can be formed as an RS flip-flop having input terminals of R (Reset) and S (Set). In this case, the output of the comparing device 51 is inputted to the Set input terminal of the latch unit 52, and the release signal S1 is inputted to the Reset input terminal.

After the smoothing capacitor voltage Vdc becomes equal to or greater than the reference voltage value and the output of the comparing device 51 becomes "1" for abnormal case, the output of the latch unit 52 is fixed at "1" even when the output of the comparing device 51 is changed to "0" for a normal case. When "1" is inputted as the release signal S1, the output of the latch unit 52 is changed from "1" to "0", whereby abnormality determination can be canceled.

The release signal S1 may be inputted from outside by an operator, or may be generated in the control unit 50, for example. In the case of generating the release signal S1 in the control unit 50, for example, the output of the comparing device 51 is inverted by an inverter and then is delayed by a predetermined period by a delay device. Thus, after the predetermined period elapses from when the smoothing capacitor voltage Vdc has become smaller than the reference voltage value, the output of the latch unit 52 becomes "0" for a normal case. By providing the latch unit 52 at the output stage of the comparing device 51 as described above, the control unit 50 is prevented from frequently repeating a later-described protection operation for abnormal case and a normal operation alternately, whereby damage of devices can be prevented.

Next, the gate signal generation units 53, 54, 55 will be described.

The gate signal generation unit 53 generates a gate signal G3a for each switching element 36 included in the inverter 35. In addition, the gate signal generation units 54, 55 respectively generate gate signals G1a, G2a for the first switching element 5 and the second switching element 6 included in the multilevel boosting circuit 20.

Finally, the gate block units 56, 57, 58 will be described.

The gate block units 56, 57, 56 are provided for the purpose of setting, to "0", gate signals G1, G2, G3 for the first switching element 5 and the second switching element 6 included in the multilevel boosting circuit 20 and each switching element 36 included in the inverter 35 in an abnormal case where the smoothing capacitor voltage Vdc is overvoltage. The gate block units 56, 57, 58 can be formed by logic circuits.

The gate block unit 56 receives the output of the latch unit 52 and the gate signal G3a. The gate block unit 57 receives the output of the latch unit 52 and the gate signal G1a. The gate block unit 58 receives the output of the latch unit 52 and the gate signal G2a.

The output signals (gate signals G1, G2, G3) of the gate block units 56, 57, 58 are determined by logic shown in FIG. 3. That is, only when the gate signals G1a, G2a, G3a are "1" and the output of the latch unit 52 is "0" for normal case, the control unit 50 causes the gate block unit 56, 57, 58 to output the gate signal G1, G2, G3 of "1", and in an abnormal case, the control unit 50 executes a protection node to output the gate signals G1, G2, G3 of "0".

That is, in a normal case where the smoothing capacitor voltage Vdc is lower than the reference voltage value, the control unit 50 operates in a normal mode to perform ON/OFF control for the first switching element 5 and the second switching element 6 of the multilevel boosting circuit 20, thus causing the multilevel boosting circuit 20 to output multilevel voltages. Further, the control unit 50 performs ON/OFF control for each switching element 36 of the inverter 35 to generate AC voltage.

On the other hand, in an abnormal case where the smoothing capacitor voltage Vdc is equal to or creator than the reference voltage value, the control unit 50 operates in a protection mode to fix the first switching element 5 and the second switching element 6 of the multilevel boosting circuit 20 in OFF if states and stop the switching operation of each switching element 36 of the inverter 35, thus performing gate blocking.

In FIG. 2, the configuration of having three gate block units 56, 57, 58 for outputting the gate signal G1 for the first switching element 5, the gate signal G2 for the second switching element 6, and the gate signal G3 for the inverter 35, has been shown, however, in actuality, as the gate signal G3 for the inverter 35, six signals corresponding to the number of the switching elements 36 are needed and therefore six gate block units are needed. Thus, a total of eight gate block units are needed, including the gate block units for the first switching element 5 and the second switching element 6 of the multilevel boosting circuit 20. In FIG. 2, illustration of some of the gate block units is omitted for the purpose of preventing complication of the drawing.

Next, the effects of the protection mode executed by the control unit 50 of the power, conversion device 100 according to the present embodiment will be described with reference to the drawings.

Figure 4:
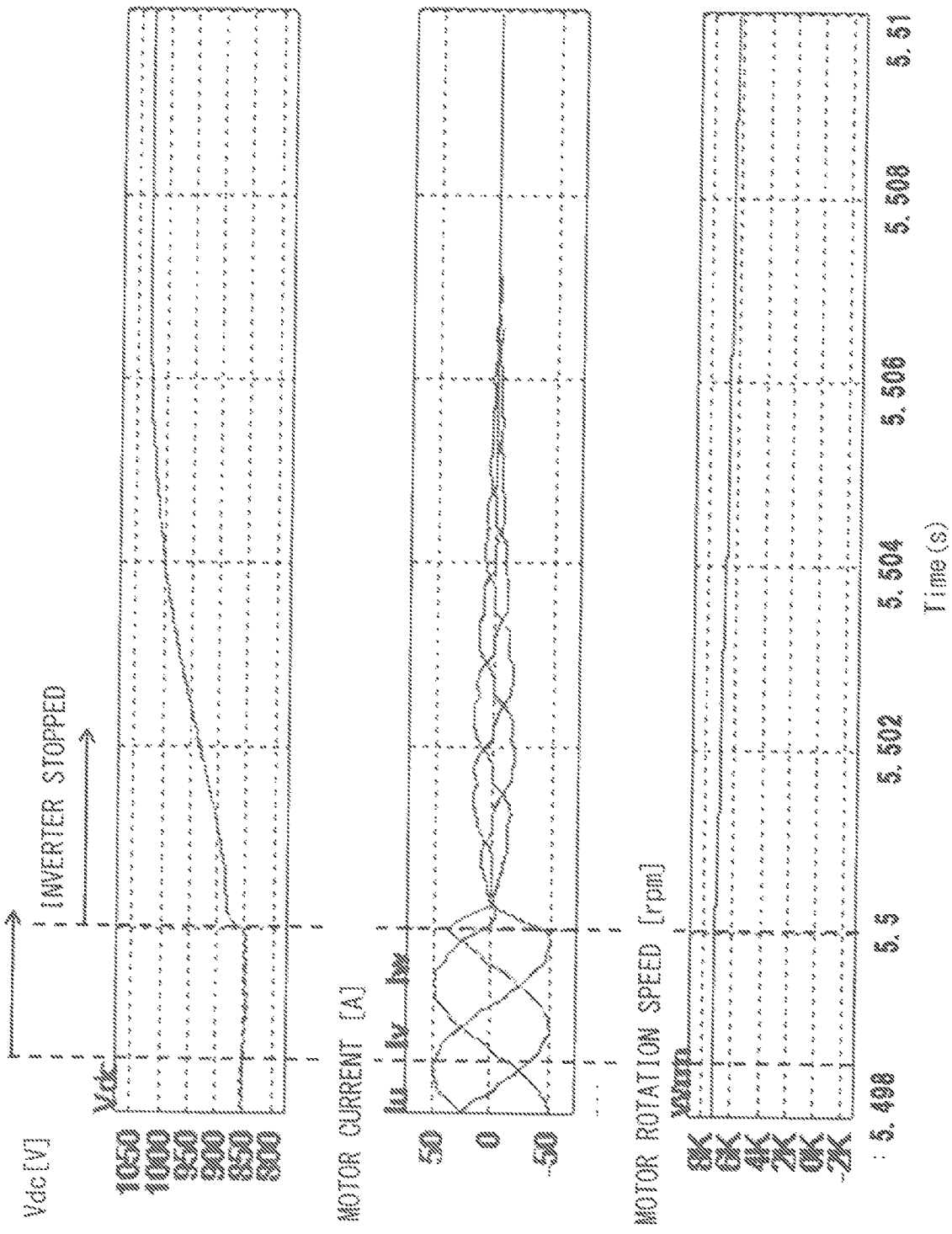
FIG. 4 is a waveform diagram showing operation of the power conversion device according to embodiment 1.

FIG. 4 is a waveform diagram showing operation of the power conversion device 100 immediately after the protection mode is executed during operation of the power conversion device 100.

FIG. 5 shows voltages at several parts in the power conversion device 100 when the protection mode is executed.

In FIG. 4, three waveforms are shown, and these waveforms represent, from the top, the smoothing capacitor voltage Vdc, the current of the AC motor 40, and the rotation speed of the AC motor 40.

During operation of the power conversion device 100, it is assumed that the smoothing capacitor voltage Vdc increases due to some abnormality and reaches overvoltage. Then, the control unit 50 of the power conversion device 100 detects voltage increase of the smoothing capacitor voltage Vdc and executes the protection mode. After the protection mode is started, the first switching element 5 and the second switching element 6 of the multilevel boosting circuit 20 are fixed in OFF states at time 5.5 s, and the inverter 35 is gate-blocked and stopped.

When the control unit 50 stops the inverter 35, regeneration operation occurs due to inductance energy of the AC motor 40 and electromotive force of the AC motor 40, so that the smoothing capacitor voltage Vdc further increases from 850 V to reach about 1030 V. In particular, in such a case where the smoothing capacitor 30 has a small capacitance or the rotation speed of the AC motor 40 is great, the smoothing capacitor voltage Vdc readily increases.

Voltages applied to the semiconductor elements of the leg portion 8 of the multilevel boosting circuit 20 when the smoothing capacitor voltage Vdc is overvoltage as described above are as shown in FIG. 5.

In FIG. 5, the smoothing capacitor voltage Vdc is 1030 V and the intermediate capacitor voltage Vm is 850/2=425 V. The smoothing capacitor voltage Vdc is cited from the result shown in FIG. 4. The speed of change in the intermediate capacitor voltage Vm is sufficiently slower than the speed of change in the smoothing capacitor voltage Vdc, and thus the intermediate capacitor voltage Vm does not change as compared to that before the inverter is stopped. Therefore, the intermediate capacitor voltage Vm is equal to voltage before the stoppage, i.e., 425 V.

In the protection mode, the first switching element 5 and the second switching element 6 of the leg portion 8 of the multilevel boosting circuit 20 are fixed in OFF states. Therefore, as shown in FIG. 6, voltages applied to the first diode and the second switching element 6 of the leg portion 8 of the multilevel boosting circuit 20 are 302.5 V which is obtained by subtracting the intermediate capacitor voltage Vm (425 V) from the smoothing capacitor voltage Vdc (1030 V) and then dividing the resultant value by 2. In addition, voltages applied to the second diode 4 and the first switching element 5 are 212.5 V which is obtained by dividing the intermediate capacitor voltage Vm (425 V) by 2.

Here, a comparative example in which the first switching element 5 and the second switching element 6 of the multilevel boosting circuit 20 are not fixed in OFF states when the smoothing capacitor voltage Vdc is overvoltage, will be described.

FIG. 6 shows voltages at several parts in the power conversion device in the comparative example.

In an abnormal case where the smoothing capacitor voltage Vdc is overvoltage, if the first switching element 5 and the second switching element 6 are not fixed in OFF states, as shown in FIG. 5, voltage applied to each semiconductor element of the leg portion 8 of the multilevel boosting circuit 20 differs depending on the ON/OFF states of the gate signals G1, G2 for the first switching element 5 and the second switching element 6.

It is found that, when the gate signal G2 is OX (the second switching element 6 is ON), excessive voltage of 605 V which is obtained by subtracting the intermediate capacitor voltage Vm (420 V) from the smoothing capacitor voltage Vdc (1030 V) is applied to the first diode 3. In the case of the multilevel circuit, it is general to use a semiconductor element having lower withstand voltage than the inverter. Therefore, if elements having withstand voltage of 600 V are used, there is a possibility that the multilevel boosting circuit is deteriorated.

As described above, the control unit 30 of the power conversion device 100 in the present embodiment executes the protection mode in an abnormal case where the smoothing capacitor voltage Vdc becomes overvoltage during operation of the power conversion device 100. Then, in the protection mode, the control unit 50 fixes the first switching element 5 and the second switching element 6 of the multilevel boosting circuit 20 in OFF states, and stops the inverter 35. Although the smoothing capacitor voltage Vdc might further increase when the inverter 35 is stopped, even in this case, excessive voltage can be prevented from being applied to the semiconductor elements in the multilevel boosting circuit 20.

Thus, when the power conversion device 100 is abnormal, the control unit 50 can stop the power conversion device 100 while suppressing overvoltage or each semiconductor, element in the multilevel boosting circuit 20.

The semiconductor elements corresponding to parts shown by (*) in FIG. 5 and FIG. 6 are semiconductor elements to which applied voltage in the leg portion 8 is distributed. In the case where the applied voltage is distributed to the semiconductor elements as described above, if there is variation in the impedances of the semiconductor elements, the applied voltage is not equally distributed. Even in such a case, the applied voltage can be equally distributed by connecting a resistor having sufficiently smaller impedance than each semiconductor element, in parallel to the semiconductor element.

In the power conversion device 100 according to the present embodiment, the applied voltages distributed to the first diode 3 and the second switching element 6 in the leg portion 8 are required to be balanced. Therefore, the balance resistors 10, 11 are respectively connected in parallel to only the first diode 3 and the second switching element 6 among the four semiconductor elements (first diode 3, second diode 4, first switching element 5, second switching element) composing the leg portion 3.

In addition, the resistance values of the balance resistors 10, 11 are determined in consideration of the impedances of the first diode 3 and the second switching element 6 in OFF states, so as to equalize the applied voltages on the first diode 3 and the second switching element 6.

In FIG. 5 and FIG. 6, regarding the impedances of the first diode 3, the second diode 4, the first switching element 5, and the second switching element 6 in OFF states, calculation is performed under the condition that ail the semiconductor elements have the same impedance value. In addition, calculation is performed on the assumption that the impedances of the first, diode 3, the second diode 4, the first switching element 5, and the second switching element 6 in ON states are zero.

Hereinafter, a power conversion system in which the configuration of the DC power supply unit 1 is modified will be described.

Figure 7:
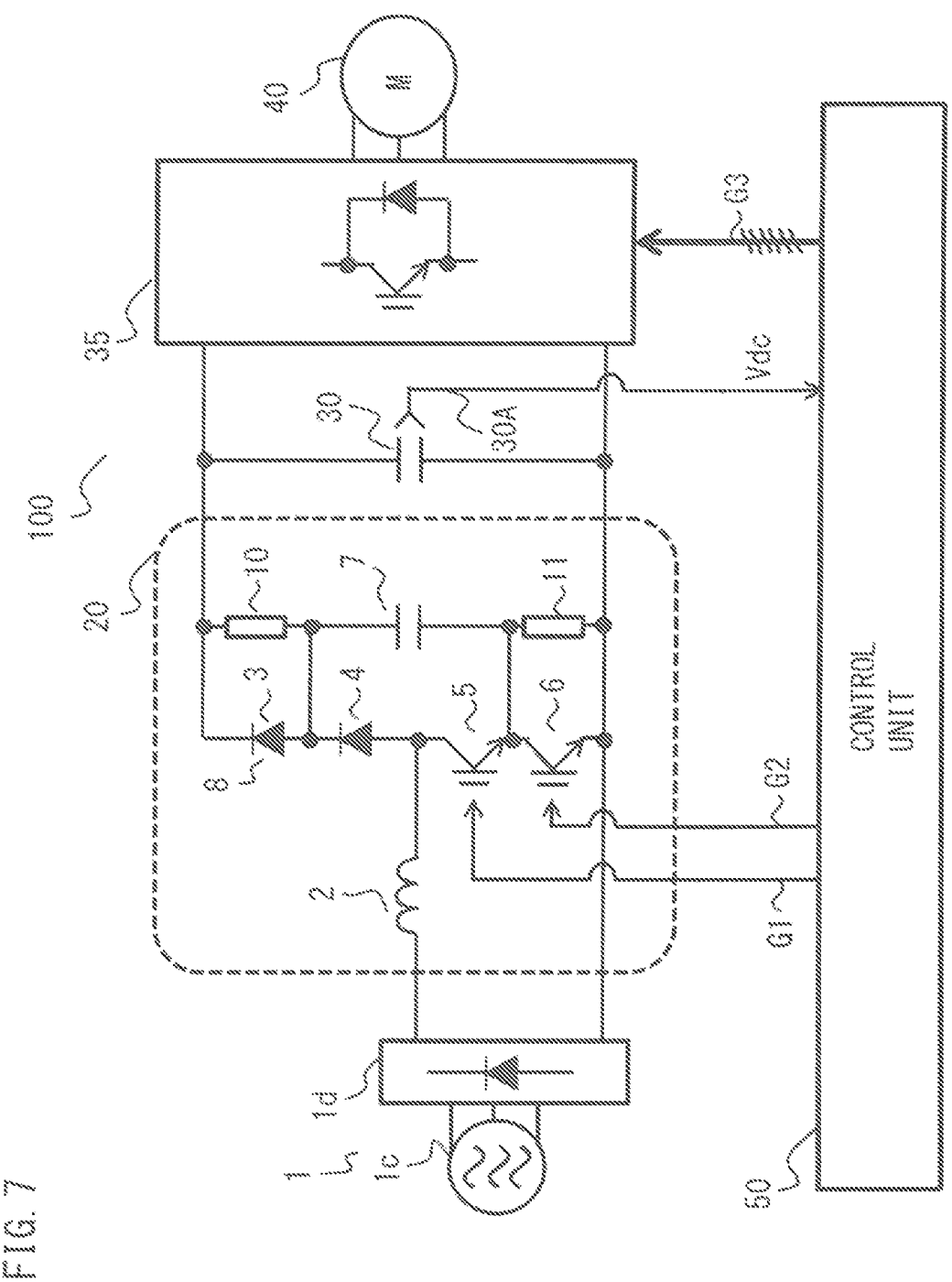
FIG. 7 is a diagram showing the schematic configuration of a power conversion system including the power conversion device according to embodiment 1.

FIG. 7 shows the schematic configuration of the power conversion system in which the configuration of the DC power supply unit 1 is modified.

In FIG. 1, the example in which a DC power supply is used for the DC power supply unit 1 has been shown. However, without limitation to this configuration, the DC power supply unit 1 may be composed of a three-phase AC power supply 1c as an AC power supply, and a diode rectifier 1d which rectifies output, voltage of the three-phase AC power supply 1c.

Also in the case where the configuration of the DC power supply unit 1 is modified as described above, the power conversion device 100 according to the present embodiment can be applied in the same manner.

The three-phase AC power supply 1c may be replaced with a single-phase AC power supply as an AC power supply.

In the above description, the case where the control unit 50 stops the inverter 35 by the protection mode after the smoothing capacitor voltage Vdc has become overvoltage has been shown. However, even in the case where the inverter 35 is stepped first due to some abnormality occurring in the power conversion device 100 and as a result, the smoothing capacitor voltage Vdc becomes equal to or greater than the reference voltage value, the control unit 50 can execute the protection mode in the same manner.

In the power conversion device 100 of the present embodiment configured, as described above, the control unit 50 executes the protection mode to fix the first switching element 5 and the second switching element 6 of the multilevel boosting circuit 20 in OFF states, in an abnormal case where the smoothing capacitor voltage Vdc is overvoltage.

Thus, it is possible to provide the power conversion device 100 that swiftly prevents excessive voltage from being applied to each semiconductor element of the leg portion if of the multilevel boosting circuit 20 and suppresses deterioration in the semiconductor elements of the leg portion 8, thereby achieving high reliability.

Further, the balance resistors 10, 11 are respectively connected in parallel to the first diode 3 and the second switching element 6 of the multilevel boosting circuit 20. Thus, even in the case where there is great variation in the impedances of the first diode 3 and the second switching element 6 in OFF states, it is possible to stabilize the ratio of the applied voltages distributed to the first diode 3 and the second switching element 6. As a result, deterioration in the semiconductor elements of the leg portion 8 can be further suppressed.

In addition, since the balance resistors are provided to only the first diode 1 and the second switching element 6, the number of the used balance resistors is small. Thus, the size of the hardware device configuration can be reduced.

In addition, the resistance values of the balance resistors 10, 11 are determined so as to equalize voltages applied to the first diode 3 and the second switching element 6. Thus, it is possible to further stabilize the ratio of the applied voltages distributed to the first diode 3 and the second switching element 6.

Further, in an abnormal case where the smoothing capacitor voltage Vdc is overvoltage, the control unit 50 executes the protection mode to step switching operations of the switching elements 36 included in the inverter 35, thereby stopping the inverter 35. In the case where the inverter 35 continues operating when the power conversion device 100 is abnormal, the inverter 35 is swiftly stopped, whereby the power conversion device 100 can be stopped. In addition, even in the case where the smoothing capacitor voltage Vdc further increases due to stoppage of the inverter 35, the semiconductor elements in the multilevel boosting circuit 20 are prevented from being subjected to overvoltage, by protection control.

Further, if it is detected that the smoothing capacitor voltage Vdc has become smaller than the reference voltage value after the protection mode is executed, the control unit 50 cancels the protection mode after a predetermined period elapses from the detection. Thus, the protection operation for abnormal case and the normal operation are prevented from being frequently repeated alternately, whereby deterioration in components of the power conversion device 100 can be prevented.

In the case where the first diode 3 and the second diode 4 in the multilevel boosting circuit 20 are replaced with semiconductor switching elements, the control unit 50 performs ON/OFF control for these semiconductor switching elements in accordance with a power-running/regeneration operation mode of the multilevel boosting circuit 20. Further, in the protection mode, the control unit 50 fixes the first switching element 5 and the second switching element 6 in OFF states and also fixes the above semiconductor switching elements in OFF states.

Embodiment 2

Hereinafter, the present embodiment 2 will be described with reference to the drawings, focusing on parts different from the above embodiment 1. The same parts as those in the above embodiment 1 are denoted by the same reference characters and the description thereof is omitted.

Figure 8:
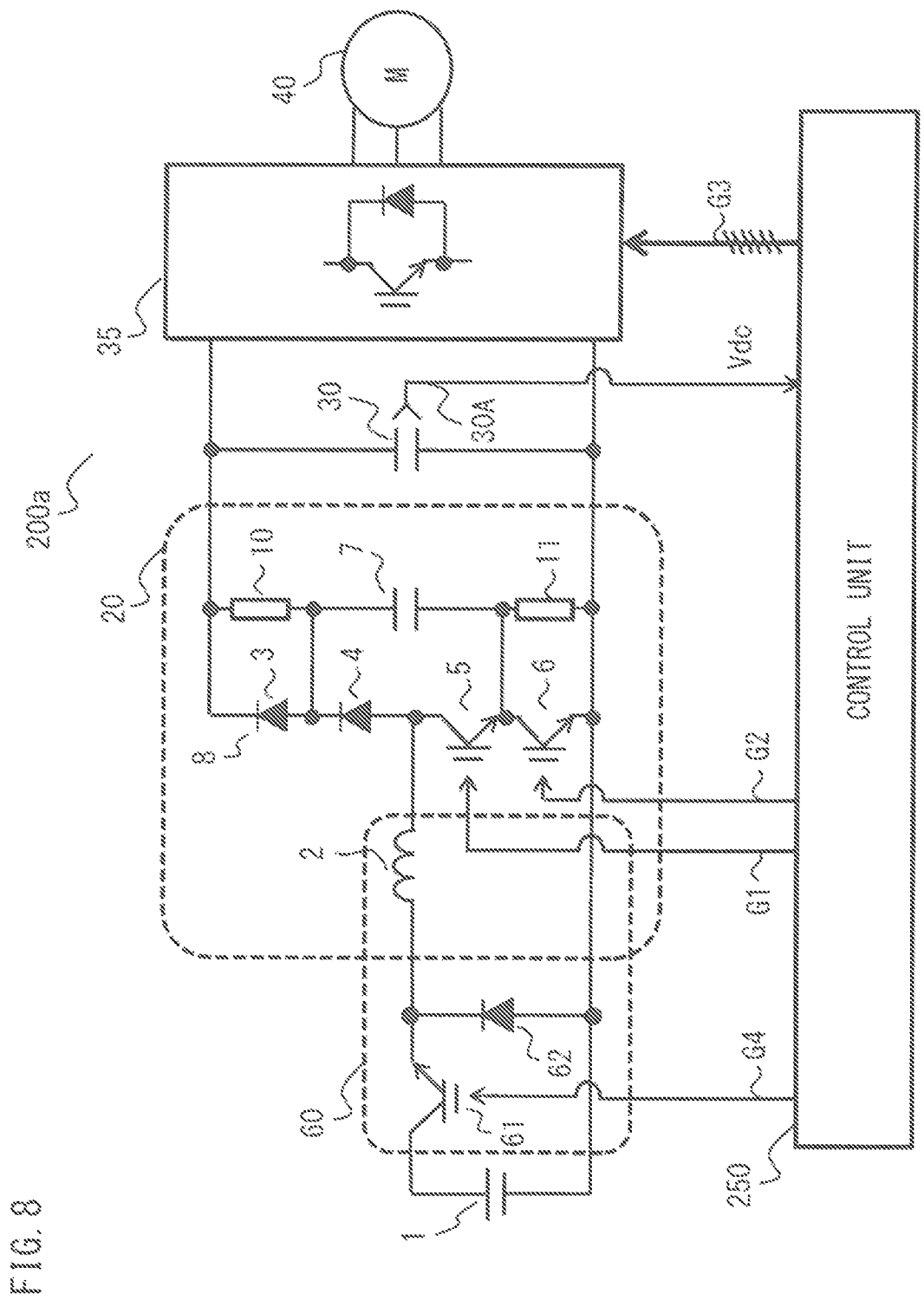
FIG. 8 is a diagram showing the schematic configuration of a power conversion system including a power conversion device according to embodiment 2.

FIG. 8 is a diagram showing the schematic configuration of a power conversion system including a power conversion device 200a according to the present embodiment 2.

Figure 9:
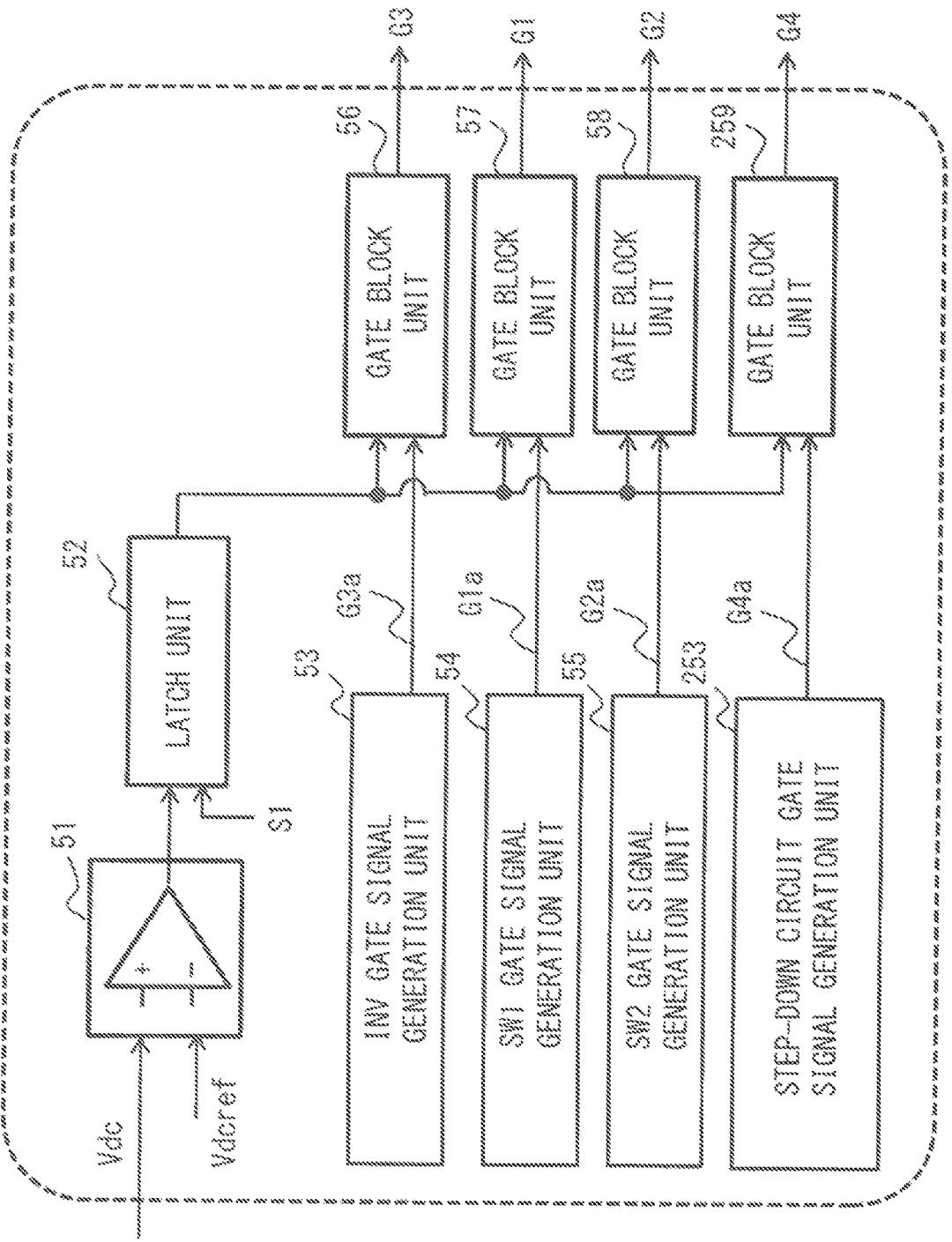
FIG. 9 is an internal configuration diagram of a control unit according to embodiment 2.

FIG. 9 is an internal configuration diagram of a control unit 250 according to the present embodiment 2.

FIG. 10 shows the relationship between input and output of gate block units 56, 57, 58, 59 shown in FIG. 9.

In the present embodiment, a step-down circuit 60 is provided between the DC power a apply unit 1 and the multilevel boosting circuit 20. The step-down circuit. 60 includes a third switching element 61, the reactor 2, and a flyback diode 62.

The third switching element 61 is connected in series between the DC power supply unit 1 and the input end of the reactor 2, and is subjected to ON/OFF control by pulse width modulation (PWM) so that DC voltage from the DC power supply unit 1 becomes target voltage.

The flyback diode 62 is provided such that the cathode side thereof is connected to the connection point between the DC power supply unit 1 and the reactor 2, so that current outputted from the output end of the reactor 2 returns to the input end of the reactor 2.

The third switching element 61 may be formed from a semiconductor element such as IGBT or MOSFET.

The step-down circuit 60 and the multilevel boosting circuit 20 share the reactor 2.

By connecting the step-down circuit 60 to the DC power supply unit 1 as described above, the DC voltage can be stepped down. Thus, the step-down circuit 60 and the multilevel boosting circuit 20 can form a buck-boost converter having both of a step-down function and a boosting function, whereby the control range of the smoothing capacitor voltage Vdc can be expanded.

Next, the configuration and control of the control unit 250 will be described with reference to FIG. 9.

The control unit 250 according to the present embodiment 2 further includes a gate signal generation unit 253 for generating a gate signal G4a for the third switching element 61 of the step-down circuit 60, and a gate block unit 259 to which the gate signal G4a is inputted. The operation manner of the control unit 250 is almost the same as the operation manner of the control unit 50 shown in embodiment 1, but the operation of the gate block unit 259 is different.

The output signal (gate signal G4) of the gate block unit 259 is determined by logic shown in FIG. 10. Two types of operation methods, i.e., method A and method B, can be adopted.

In the method A, in an abnormal case where the smoothing capacitor voltage Vdc is equal to or greater than the reference voltage value (output of the latch unit 52 is 1), the control unit 250 executes the same protection mode as in embodiment 1, and further, fixes the third switching element 61 of the step-down circuit 60 in an OFF state constantly.

In the method B, in an abnormal case where the smoothing capacitor voltage Vdc is equal to or greater than the reference voltage value, the control unit 250 executes the same protection mode as in embodiment 1, and further, fixes the third switching element 61 of the step-down circuit 60 in an ON state constantly.

In the case where the step-down circuit 60 is provided when the smoothing capacitor voltage Vdc becomes overvoltage, switching operation of the third switching element 61 by is not performed and the third switching element 61 is fixed in an ON state or an OFF state as described above.

As a matter of course, the step-down circuit 60 is net limited to the circuit configuration shown in FIG. 8, but may be modified into another circuit configuration such as a multilevel circuit configuration.

Hereinafter, another configuration of a power conversion device different from the configuration of the power conversion device 200a shown above in FIG. 8 will be described.

Figure 11:
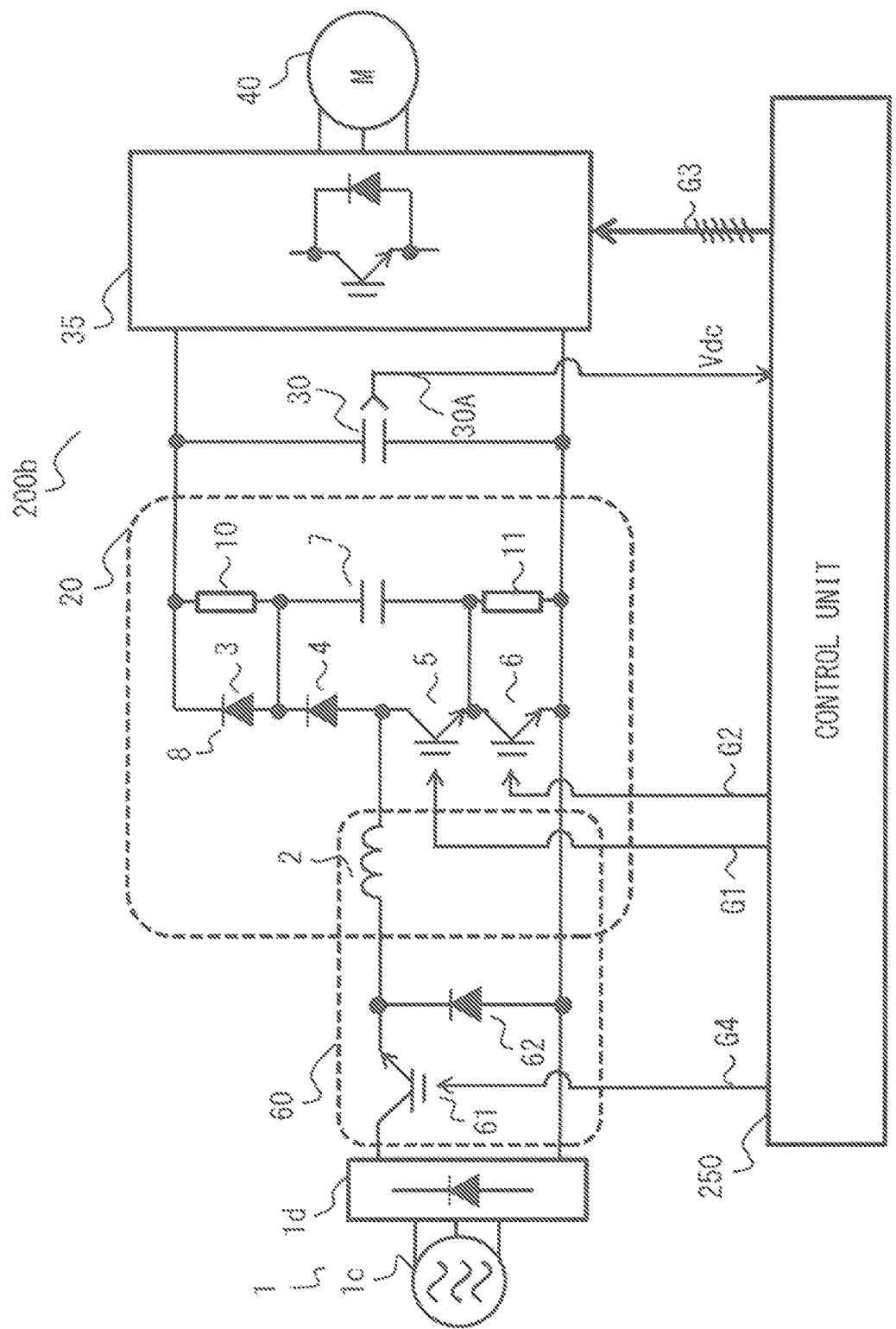
FIG. 11 is a diagram showing the schematic configuration of a power conversion system including the power conversion device according to embodiment 2.

FIG. 11 is a diagram showing the schematic configuration of a power conversion device 200b in the present embodiment 2.

The power conversion device 200b shown in FIG. 11 includes the DC power, supply unit 1 composed of the three-phase AC power supply 1c and the diode rectifier 1d shown in FIG. 7 in embodiment 1, and the step-down circuit 60 shown in FIG. 8.

In the power conversion devices 200a, 200b of the present embodiment configured as described above, the step-down circuit 60 is provided, whereby the control range of the smoothing capacitor voltage Vdc can be expanded. Further, when the smoothing capacitor voltage Vdc becomes overvoltage, as in embodiment 1, the control unit 250 fixes the first switching element 5 and the second switching element 6 of the multilevel boosting circuit 20 in OFF states and executes the protection mode to stop switching operations of the switching elements 36 in the inverter 35. Moreover, in the protection mode, the control unit 230 fixes the third switching element 61 of the step-down circuit 60 in an ON state or an OFF state, whereby the power conversion device 100 can be stopped appropriately.

Thus, it is possible to provide the power conversion devices 200a, 200b that, swiftly prevent excessive voltage from being applied to the semiconductor elements in the power conversion devices 200a, 200b, thereby achieving high reliability. The three-phase AC power, supply 1c may be replaced with a single-phase AC power, supply as an AC power supply.

Embodiment 3

Hereinafter, the present, embodiment 3 will be described with reference to the drawings, focusing on parts different from the above embodiment 1. The same parts as those in the above embodiment 1 are denoted by the same reference characters and the description thereof is omitted.

Figure 12:
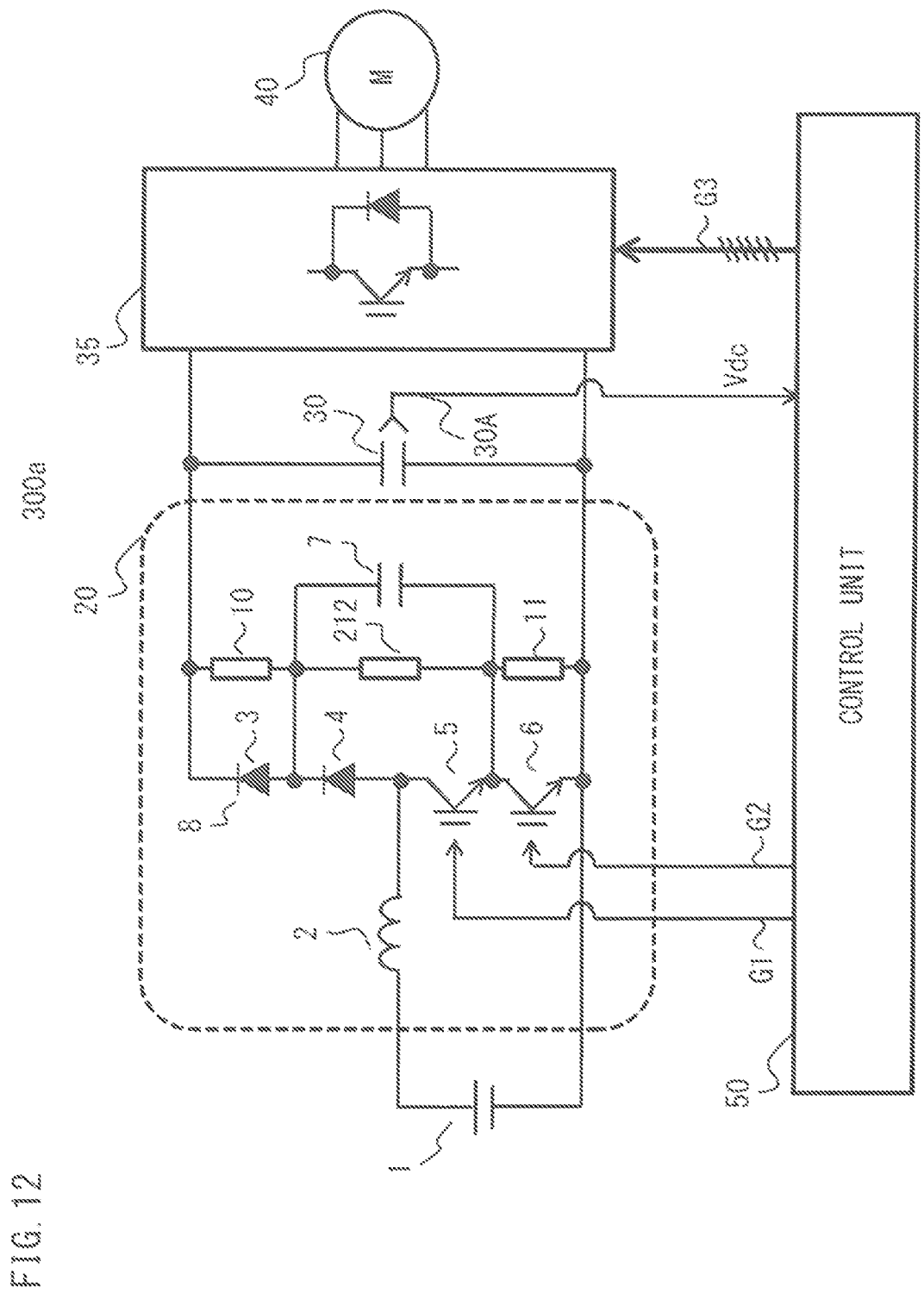
FIG. 12 is a diagram showing the schematic configuration of a power conversion system including a power conversion device according to embodiment 3.

FIG. 12 is a diagram showing the schematic configuration of a power conversion system including a power conversion device 300a according to the present embodiment 3.

Figure 13:
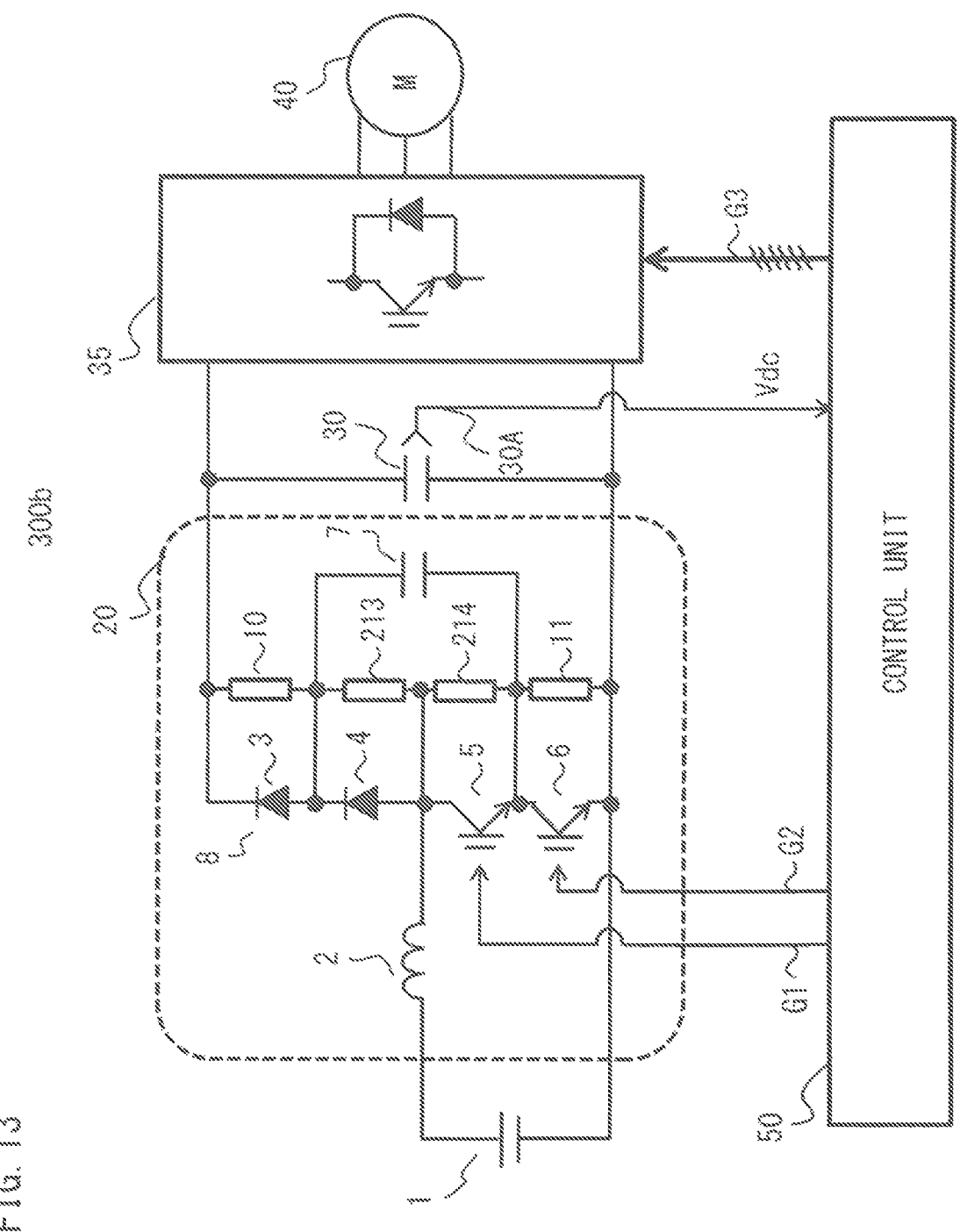
FIG. 13 is a diagram showing the schematic configuration of a power conversion system including a power conversion device according to embodiment 3.

FIG. 13 is a diagram showing the schematic configuration of a power conversion system including a power conversion device 300b having a configuration different from the power conversion device 300a shown in FIG. 22.

Figure 14:
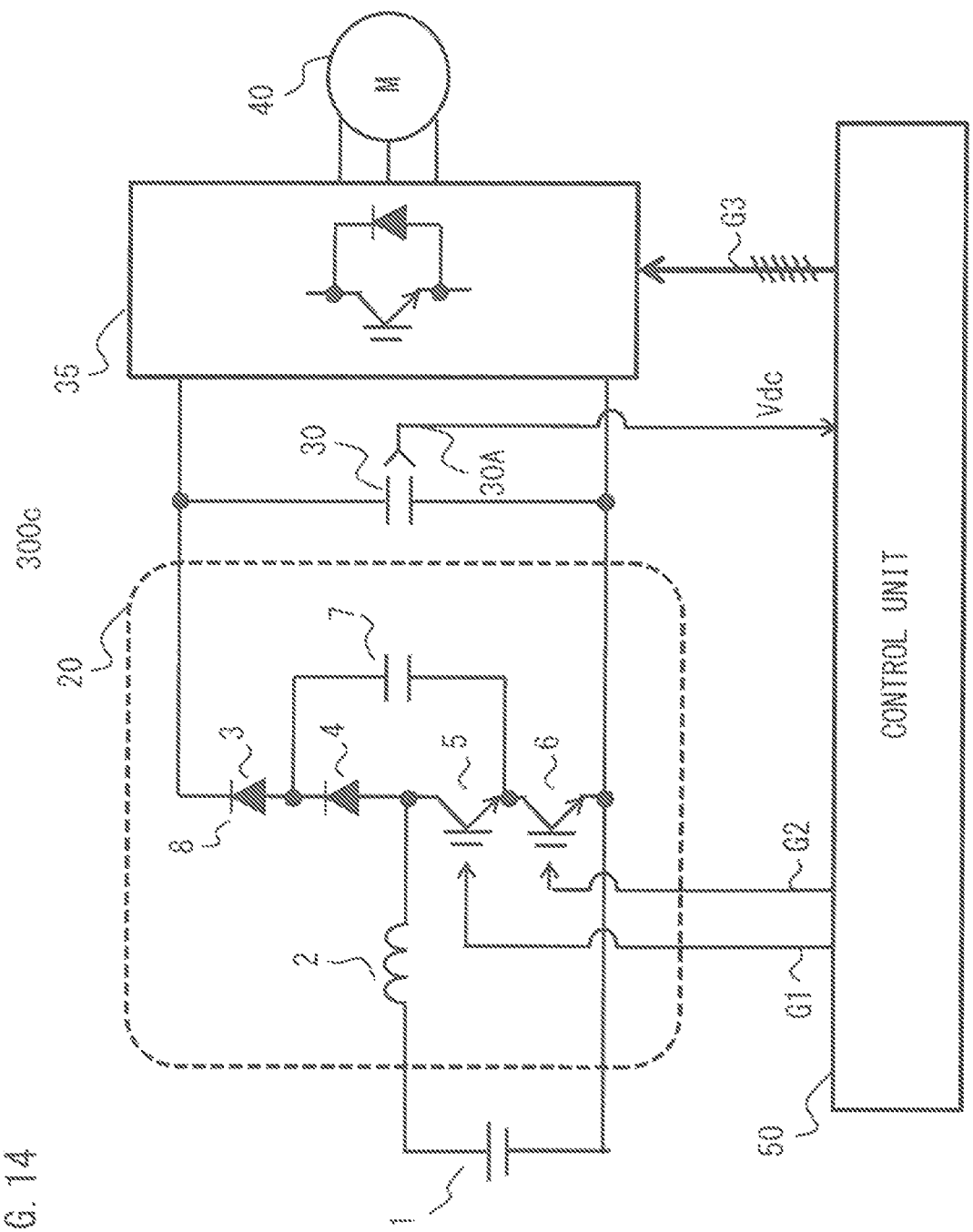
FIG. 14 is a diagram showing the schematic configuration of a power conversion system including a power conversion device according to embodiment 3.

FIG. 14 is a diagram showing the schematic configuration of a power conversion system including a power conversion device 300c having a configuration different from the power conversion devices 300a, 300b shown in FIG. 12 and FIG. 13.

The present embodiment is different from embodiment 1 in the number and the placement of balance resistors for stabilizing the ratio of applied voltages distributed to the semiconductor elements of the leg portion 8 of the multilevel boosting circuit 20.

In the power conversion device 300a shown in FIG. 12, in addition to the balance resistors 10, 11 shown in embodiment 1, a balance resistor 212 is connected in parallel to the intermediate capacitor 7, i.e., in parallel to the second diode 4 and the first switching element 5 connected in series to each other.

Thus, irrespective of the charge/discharge state of the intermediate capacitor 7, the ratio of the applied voltages distributed to the semiconductor elements of the leg portion 8 can be assuredly stabilized.

In the power conversion device 300b shown in FIG. 13, in addition to the balance resistors 10, 11 shown in embodiment 1, balance resistors 213, 214 are respectively connected to the second diode 4 and the first switching element 5.

Thus, irrespective of the impedances of the second diode 4 and the first switching element 5 in OFF states, the ratio of the applied voltages distributed to the semiconductor elements of the leg portion 8 can be assuredly stabilized.

In the cover conversion device 300c shown in FIG. 14, no balance resistors are provided.

In the case where there is small variation in the impedances of the first diode 3 and the second switching element 6 in OFF states and therefore there is no risk of exceeding the withstand voltages of the semiconductor elements, a configuration having no balance resistors can be adopted as described above. Thus, the size of the hardware device configuration can be reduced.

In each of the power conversion devices 300a, 300b, 300c, as in embodiment 2, the step-down circuit 60 may be added or the DC power supply unit 1 may be composed of the three-phase AC power supply 1c and the diode rectifier 1d.

In the power conversion device 300a of the present embodiment configured as described above, the balance resistor 212 is connected in parallel to the intermediate capacitor 7, whereby the ratio of applied voltages distributed to the semiconductor elements of the leg portion 8 can be stabilised irrespective of the discharge state of the intermediate capacitor 7. Thus, excessive voltage can be further assuredly prevented from being applied to the semiconductor elements of the leg portion 8 of the multilevel boosting circuit 20.

In the power conversion device 300b of the present embodiment configured as described above, the balance resistors 213, 214 are respectively connected to the second diode 4 and the first switching element 5, whereby the ratio or applied voltages distributed to the semi conduct or elements of the leg portion ft can be stabilized irrespective of the impedances of the second diode 4 and the first switching element 5 in OFF states. Thus, excessive voltage can be further assuredly prevented from being applied to the semiconductor elements of the leg portion ft of the multilevel boosting circuit 20.

Thus, it is possible to provide the power conversion device that swiftly and assuredly prevents excessive voltage from being applied to the semiconductor elements in the power conversion device, thereby achieving high reliability.

In the power conversion device 300c of the present embodiment configured as described above, no balance resistors are provided and thus the size of the hardware device configuration can be reduced.

Embodiment 4

Hereinafter, the present embodiment 4 will be described with reference to the drawings, focusing on parts different from the above embodiment 2. The same parts as those in the above embodiment 2 are denoted by the same reference characters and the description thereof is omitted.

Figure 15:
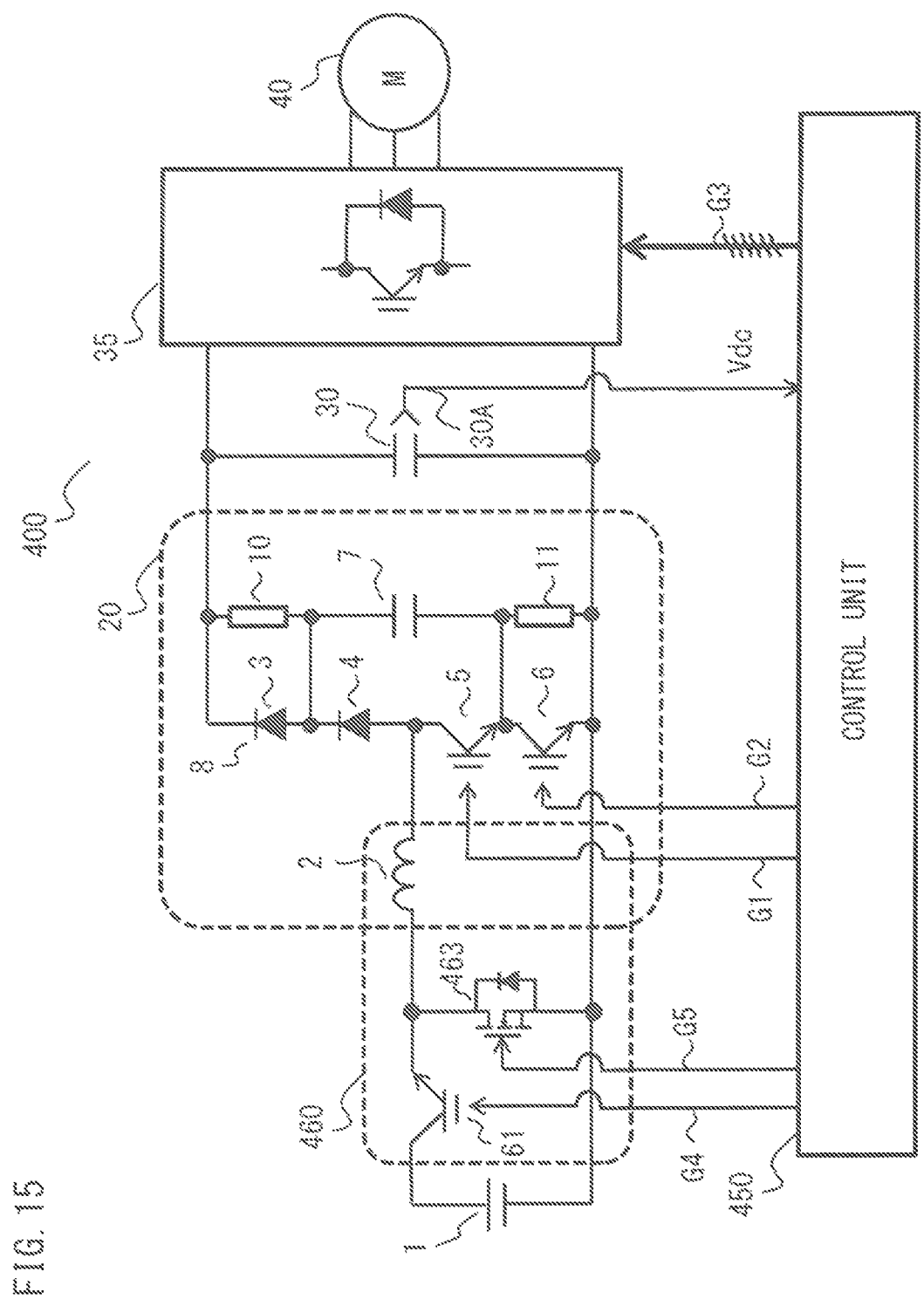
FIG. 15 is a diagram showing the schematic configuration of a power conversion system including a power conversion device according to embodiment 4.

FIG. 15 is a diagram showing the schematic configuration of a power conversion system including a power conversion device 400 according to the present embodiment 3.

Figure 16:
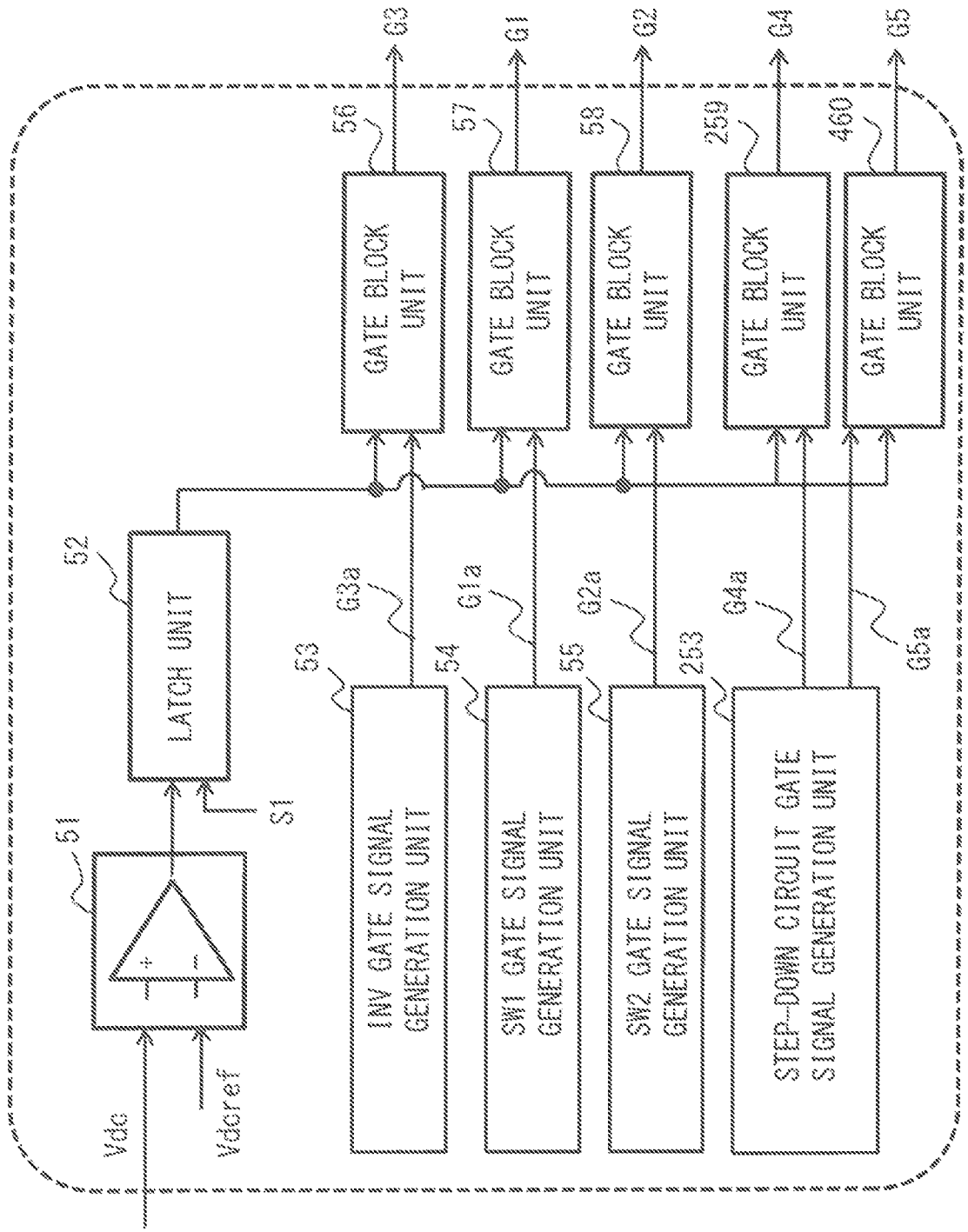
FIG. 16 is an internal configuration diagram of a control unit according to embodiment 4.

FIG. 16 is an internal configuration diagram of a control unit 450 in the present embodiment 4.

FIG. 17 shows the relationship between input and output of gate block units 56, 57, 58, 259, 460 shown in FIG. 16.

The power conversion device 400 of the present embodiment is different in the configuration of a step-down circuit 460 and control in the control unit 450, as compared to the power conversion device 200a of embodiment 2 shown in FIG. 8.

The step-down circuit 460 is obtained by replacing the flyback diode 62 in the step-down circuit 60 shown in embodiment 2, with a fourth switching element 463, and here, is caused to perform synchronous rectification operation using the fourth switching element 63, whereby the step-down circuit 460 is operated with high efficiency. As shown in FIG. 15, a MOSFET is used as the fourth switching element 463, and when current flows back, this MOSFET is turned on, whereby conduction loss can be reduced as compared to the case of using the diode 62.

Next, the configuration and control of the control unit 450 will be described with reference to FIG. 16 and FIG. 17.

In the control unit 450 of the present embodiment 4, the gate signal generation unit 253 of the step-down circuit 460 generates the gate signal G4a for the third switching element 61, and in addition, generates a gate signal G5a for the fourth switching element 463. The control unit 450 further includes the gate block unit 460 to which the gate signal G5a is inputted.

The operation manner of the control unit 450 is almost the same as the operation manner of the control unit 250 shown in embodiment 2. Hereinafter, operation of the added gate block unit 460 will be described.

The output signal (gate signal G5) of the gate block unit 460 is determined by logic shown in FIG. 17. As in embodiment 2, two types of operation methods, i.e., method A and method B, can be adopted. In both of the method A and the method B, the control unit 450 fixes the switching state of the fourth switching element 463 in an OFF state constantly when the output of the latch unit 52 is 1. Thus, in the protection mode when the smoothing capacitor voltage Vdc is overvoltage, the control unit 450 fixes the fourth switching element 463 in an OFF state constantly, without, performing synchronous rectification operation of the step-down circuit 460. In this way, it is possible to appropriately stop the power conversion device 400 when the smoothing capacitor voltage Vdc becomes overvoltage.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS

1 DC power supply unit
1c AC power supply
1d diode rectifier
2 reactor
3 first diode
4 second diode
5 first switching element
6 second switching element
7 intermediate capacitor
30 smoothing capacitor
35 inverter
50, 250, 450 control unit
10, 11, 212, 213, 214 balance resistor
60, 460 step-down circuit
61 third switching element
463 fourth switching element
100, 200a, 200b, 300a, 300b, 300c, 400 power conversion device

The invention claimed is:

1. A power conversion device comprising:
a boosting converter for boosting an output voltage from a DC power supply;
a smoothing capacitor for smoothing output voltage of the boosting converter;
an inverter for converting voltage of the smoothing capacitor to AC voltage; and
a controlling circuitry for controlling the boosting converter and the inverter, wherein
the boosting converter includes:
a reactor having a first end connected to the DC power supply,
a leg portion including four semiconductor elements composed of a first semiconductor element, a second semiconductor element, a first semiconductor switching element, and a second semiconductor switching element each of which controls conduction and interruption of current, the four semiconductor elements being connected in series between positive and negative terminals of the smoothing capacitor, a second end of the reactor being connected to a connection point between the second semiconductor element and the first semiconductor switching element, and
an intermediate capacitor connected between a connection point of the first semiconductor element and the second semiconductor element, and a connection point of the first semiconductor switching element and the second semiconductor switching element, and
the controlling circuitry,
in a normal mode, performs ON/OFF control for the first semiconductor switching element and the second semiconductor switching element so as to cause the boosting converter to output multilevel voltages, and
when voltage of the smoothing capacitor is equal to or greater than a reference voltage value, executes a protection mode to fix the first semiconductor switching element and the second semiconductor switching element in OFF states.

2. The power conversion device according to claim 1, wherein
the boosting converter includes a plurality of balance resistors for stabilizing a ratio of applied voltages distributed to the semiconductor elements of the leg portion, and
the balance resistors are respectively connected in parallel to only the first semiconductor element and the second semiconductor switching element among the first semiconductor element, the second semiconductor element, the first semiconductor switching element, and the second semiconductor switching element of the leg portion.

3. The power conversion device according to claim 1, wherein
the boosting converter includes a plurality of balance resistors for stabilizing a ratio of applied voltages distributed to the semiconductor elements of the leg portion, and
the balance resistors are respectively connected in parallel to the first semiconductor element, the second semiconductor switching element, and the intermediate capacitor.

4. The power conversion device according to claim 1, wherein
the boosting converter includes a plurality of balance resistors for stabilizing a ratio of applied voltages distributed to the semiconductor elements of the leg portion, and
the balance resistors are respectively connected in parallel to the first semiconductor element, the second semiconductor element, the first semiconductor switching element, and the second semiconductor switching element.

5. The power conversion device according to claim 2, wherein
the balance resistors respectively connected in parallel to the first semiconductor element and the second semiconductor switching element have resistance values determined so that applied voltages to the first semiconductor element and the second semiconductor switching element are equalized.

6. The power conversion device according to claim 1, further comprising a step-down circuit having a third switching element provided between the DC power supply and the boosting converter, wherein
in the protection mode, the controlling circuitry fixes the third switching element of the step-down circuit in an ON state or an OFF state.

7. The power conversion device according to claim 6, wherein
the step-down circuit further includes a fourth switching element,
the third switching element is connected in series between the DC power supply and the first end of the reactor,
the fourth switching element is provided so that current outputted from the second end of the reactor returns to the first end of the reactor, and
in the protection mode, the control unit controlling circuitry fixes the third switching element in an ON state or an OFF state and fixes the fourth switching element in an OFF state.

8. The power conversion device according to claim 1, wherein in the protection mode, the controlling circuitry stops switching operation of a switching element included in the inverter.

9. The power conversion device according to claim 1, wherein
the DC power supply includes an AC power supply and a diode rectifier for rectifying output voltage of the AC power supply.

10. The power conversion device according to claim 1, wherein
the controlling circuitry cancels the protection mode after a predetermined period elapses from when voltage of the smoothing capacitor has become smaller than the reference voltage value.

11. The power conversion device according to claim 3, wherein
the balance resistors respectively connected in parallel to the first semiconductor element and the second semiconductor switching element have resistance values determined so that applied voltages to the first semiconductor element and the second semiconductor switching element are equalized.

12. The power conversion device according to claim 4, wherein
the balance resistors respectively connected in parallel to the first semiconductor element and the second semiconductor switching element have resistance values determined so that applied voltages to the first semiconductor element and the second semiconductor switching element are equalized.

13. The power conversion device according to claim 2, further comprising a step-down circuit having a third switching element provided between the DC power supply and the boosting converter, wherein
in the protection mode, the controlling circuitry fixes the third switching element of the step-down circuit in an ON state or an OFF state.

14. The power conversion device according to claim 3, further comprising a step-down circuit having a third switching element provided between the DC power supply and the boosting converter, wherein
in the protection mode, the controlling circuitry fixes the third switching element of the step-down circuit in an ON state or an OFF state.

15. The power conversion device according to claim 4, further comprising a step-down circuit having a third switching element provided between the DC power supply and the boosting converter, wherein
in the protection mode, the controlling circuitry fixes the third switching element of the step-down circuit in an ON state or an OFF state.

16. The power conversion device according to claim 5, further comprising a step-down circuit having a third switching element provided between the DC power supply and the boosting converter, wherein
in the protection mode, the controlling circuitry fixes the third switching element of the step-down circuit in an ON state or an OFF state.

17. The power conversion device according to claim 11, further comprising a step-down circuit having a third switching element provided between the DC power supply and the boosting converter, wherein
in the protection mode, the controlling circuitry fixes the third switching element of the step-down circuit in an ON state or an OFF state.

18. The power conversion device according to claim 12, further comprising a step-down circuit having a third switching element provided between the DC power supply and the boosting converter, wherein
in the protection mode, the controlling circuitry fixes the third switching element of the step-down circuit in an ON state or an OFF state.

19. The power conversion device according to claim 13, wherein
the step-down circuit further includes a fourth switching element,
the third switching element is connected in series between the DC power supply and the first end of the reactor,
the fourth switching element is provided so that current outputted from the second end of the reactor returns to the first end of the reactor, and
in the protection mode, the controlling circuitry fixes the third switching element in an ON state or an OFF state and fixes the fourth switching element in an OFF state.

20. The power conversion device according to claim 14, wherein
the step-down circuit further includes a fourth switching element,
the third switching element is connected in series between the DC power supply and the first end of the reactor,
the fourth switching element is provided so that current outputted from the second end of the reactor returns to the first end of the reactor, and
in the protection mode, the controlling circuitry fixes the third switching element in an ON state or an OFF state and fixes the fourth switching element in an OFF state.

21. The power conversion device according to claim 1, further comprising a step-down circuit having a third switching element provided between the DC power supply and the boosting converter.

* * * * *